US006658636B2

United States Patent
Hochapfel

(10) Patent No.: US 6,658,636 B2
(45) Date of Patent: Dec. 2, 2003

(54) CROSS FUNCTION BLOCK PARTITIONING AND PLACEMENT OF A CIRCUIT DESIGN ONTO RECONFIGURABLE LOGIC DEVICES

(76) Inventor: Eric G. F. Hochapfel, 56 rue Jeanne d'Arc, 91300 Massy (FR)

(*) Notice: Subject to any disclaimer, the term of this patent is extended or adjusted under 35 U.S.C. 154(b) by 0 days.

(21) Appl. No.: 09/901,780

(22) Filed: Jul. 9, 2001

(65) Prior Publication Data

US 2003/0009735 A1 Jan. 9, 2003

(51) Int. Cl.[7] .............................................. G06F 17/50

(52) U.S. Cl. .............................. 716/7; 716/2; 716/16; 716/9; 716/10; 716/13; 716/14

(58) Field of Search ........................................ 716/1–21

(56) References Cited

U.S. PATENT DOCUMENTS

| | | | | |
|---|---|---|---|---|
| 5,224,056 A | * | 6/1993 | Chene et al. | 716/7 |
| 5,329,470 A | | 7/1994 | Sample et al. | 703/28 |
| 5,341,308 A | * | 8/1994 | Mendel | 716/7 |
| 5,448,496 A | | 9/1995 | Butts et al. | 716/16 |
| 5,475,830 A | * | 12/1995 | Chen et al. | 716/16 |
| 5,513,124 A | * | 4/1996 | Trimberger et al. | 716/7 |
| 5,526,276 A | * | 6/1996 | Cox et al. | 716/17 |
| 5,598,343 A | * | 1/1997 | Roy et al. | 716/16 |
| 5,731,985 A | * | 3/1998 | Gupta et al. | 716/8 |
| 5,784,290 A | * | 7/1998 | Kung et al. | 716/7 |
| 5,862,149 A | * | 1/1999 | Carpenter et al. | 714/726 |
| 5,971,588 A | * | 10/1999 | Scepanovic et al. | 700/121 |
| 6,108,494 A | * | 8/2000 | Eisenhofer et al. | 703/14 |
| 6,212,670 B1 | * | 4/2001 | Kaviani | 716/17 |
| 6,286,128 B1 | * | 9/2001 | Pileggi et al. | 716/18 |
| 6,339,836 B1 | * | 1/2002 | Eisenhofer et al. | 716/5 |
| 6,397,169 B1 | * | 5/2002 | Shenoy et al. | 703/14 |
| 6,438,735 B1 | * | 8/2002 | McElvain et al. | 716/7 |
| 6,480,991 B1 | * | 11/2002 | Cho et al. | 716/8 |
| 6,490,713 B2 | * | 12/2002 | Matsumoto | 716/12 |
| 2002/0023252 A1 | * | 2/2002 | Lee et al. | 716/6 |
| 2002/0144227 A1 | * | 10/2002 | Das et al. | 716/12 |
| 2002/0194572 A1 | * | 12/2002 | McElvain et al. | 716/1 |
| 2003/0005398 A1 | * | 1/2003 | Cho et al. | 716/8 |

FOREIGN PATENT DOCUMENTS

WO WO 94/06210 3/1994 ......... H03K/19/173

OTHER PUBLICATIONS

Brasen et al., "Using cone structures for circuit partitioning into FPGA packages", IEEE Transactions on Computer–Aided Design of Integrated Circuits and Systems, vol. 17, No. 7, Jul. 1998, pp. 592–600.*

Kuznar et al., "PROP: a recursive paradigm for area–efficient and performance oriented partitioning of large FPGA netlists", 1995 IEEE/ACM International Conference on Computer–Aided Design, Nov. 5, 1995, pp. 644–649.*

(List continued on next page.)

*Primary Examiner*—Matthew Smith
*Assistant Examiner*—Phallaka Kik
(74) *Attorney, Agent, or Firm*—Banner & Witcoff, Ltd.

(57) ABSTRACT

A first and a second netlist of a first and a second function block of a circuit design are correspondingly partitioned into at least a first and a second partition, and a third and a fourth partition respectively. The first and third partitions include majorities of the constituting elements of the first and second netlists respectively. The second and fourth partitions include minorities of the constituting elements of the first and second netlists. Placements of the constituting elements of the first and third partitions are correspondingly determined. The second and fourth partitions are merged to form a composite partition, which in turn is partitioned for joint determination of placement of these minority constituting elements of the first and second netlists of the first and second function blocks on logic devices. In one embodiment, the second and fourth partitions operate in the one clock domain, while the first and third partitions operate in one or more other clock domains.

21 Claims, 5 Drawing Sheets

OTHER PUBLICATIONS

Saucier et al., "Partitioning with cone structures", 1993 IEEE/ACM International Conference on Computer–Aided Design, Nov. 7, 1993, pp. 236–239.*

NN87013460, "The TAU Algorithm", IBM Technical Disclosure Bulletin, Vol. 29, No. 8, Jan. 1, 1987, pp. 3460–3463 (6 pages).*

The Programmable Gate Array Design Handbook, © 1986 XILINX, Inc.

G. Snider et al., "The Teramac Configurable Compute Engine", pp. 44–53, Proceedings of $5^{th}$ International Workshop on Field Programmable Logic and Applications, Aug. 29, 1995, Oxford, UK.

* cited by examiner

EDA SW Suite ~ 402
- Partitioner ~ 104
- Merger ~ 112
- Compiler ~ 108

CROSS FUNCTION BLOCK PARTITIONING AND PLACEMENT OF A CIRCUIT DESIGN ONTO RECONFIGURABLE LOGIC DEVICES

BACKGROUND OF THE INVENTION

1. Field of the Invention

The present invention relates to the field of circuit partitioning. More specifically, the present invention relates to the partitioning of a circuit design for the purpose of implementing or emulating the circuit design using a number of reconfigurable logic devices.

2. Background Information

FIG. 1 illustrates a typical prior art approach to partitioning a circuit design for the purpose of implementing or emulating the circuit design using a number of reconfigurable logic devices, such as field programmable gate arrays (FPGA). As illustrated, because of the complexity of modern day circuit designs, typically, a circuit design, such as integrated circuit (IC) design 102 having multiple functional blocks (FB), FB-a 104a, FB-b 104b, and so forth, would be provided to a partitioner, such as partitioner 104, along functional block lines, and correspondingly partitioned. For example, a processor design having an instruction fetch and dispatch block, an arithmetic logic unit (ALU), a floating point processing unit (FPU), an on-chip cache memory block, a bus interface unit, and so forth, would be provided to partitioner 104 along these functional block lines, and correspondingly partitioned.

As illustrated, the partitioning would result in x1 partitions 106a for FB-a 104a, x2 partitions 106b for FB-b 104b and so forth. The partitions would be provided in turn to a "compiler", such as compiler 108, to be correspondingly compiled into a number of corresponding configuration files 110a–110n for configuring the reconfigurable logic resources of a number of corresponding logic devices to correspondingly implement or realize the constituting elements of the corresponding partitions 106a–106n of the function blocks 104a–104n. In other words, for x1, x2, . . . xn partitions 106a–106n for FB-a 104a through FB-n 104n, x1, x2, . . . xn configuration files for a total of x1+x2+ . . . xn logic devices would result.

This prior art partitioning approach may be inefficient in its usage of reconfigurable logic devices for various circuit designs, especially for IC designs where the partitioning of each function block results in one or more "small" partitions of consituting elements. Examples of IC designs where such phenomenon may occur include but are not limited to IC designs having multiple clock domains. In the multiple clock domain case, while the majority of the constituting elements of a functional block would operate in one clock domain, for various purposes, e.g. for interfacing with other function blocks that operate in other clock domains, each function block typically has small groups of consituting elements that operate in one or more of the other clock domains. Since each reconfigurable logic device typically supports only a single clock domain, accordingly the "small" partitions of constituting elements are resulted.

As those skilled in the art would appreciate that corresponding implementation or realization of these "small" partitions of constituting elements in corresponding logic devices often results in leaving a substantial amount of the reconfigurable logic resources of the corresponding logic devices unused. The amount of left over or wastage increases over time, as successive generations of reconfigurable logic devices tend to be equipped with more and more reconfigurable logic resources.

Accordingly, an improved approach to partitioning a circuit design for implementation or emulation on a number of reconfigurable logic devices is desired.

SUMMARY OF THE INVENTION

A first and a second netlist of a first and a second function block of a circuit design are correspondingly partitioned into at least a first and a second partition, and a third and a fourth partition respectively. The first and third partitions include majorities of the constituting elements of the first and second netlists respectively. The second and fourth partitions include minorities of the constituting elements of the first and second netlists. Placements of the constituting elements of the first and third partitions are correspondingly determined. The second and fourth partitions are merged to form a composite partition, which in turn is partitioned for joint determination of placement of these minority constituting elements of the first and second netlists of the first and second function blocks on logic devices.

In one embodiment, the second and fourth partitions operate in the same clock domain, while the first and third partitions operate in one or more other clock domains.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Parts of the description will be presented using terms such as accounts, IDs, objects, end-user interfaces, buttons, and so forth, commonly employed by those skilled in the art to convey the substance of their work to others skilled in the art. Parts of the description will be presented in terms of operations performed by a computer system, using terms such as creating, empowering, and so forth. As well understood by those skilled in the art, these quantities and operations take the form of electrical, magnetic, or optical signals capable of being stored, transferred, combined, and otherwise manipulated through mechanical and electrical components of a digital system; and the term digital system include general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily order dependent, in particular, the order the steps are presented. Furthermore, the phrase "in one embodiment" will be used repeatedly, however the phrase does not necessarily refer to the same embodiment, although it may.

Figure 1:
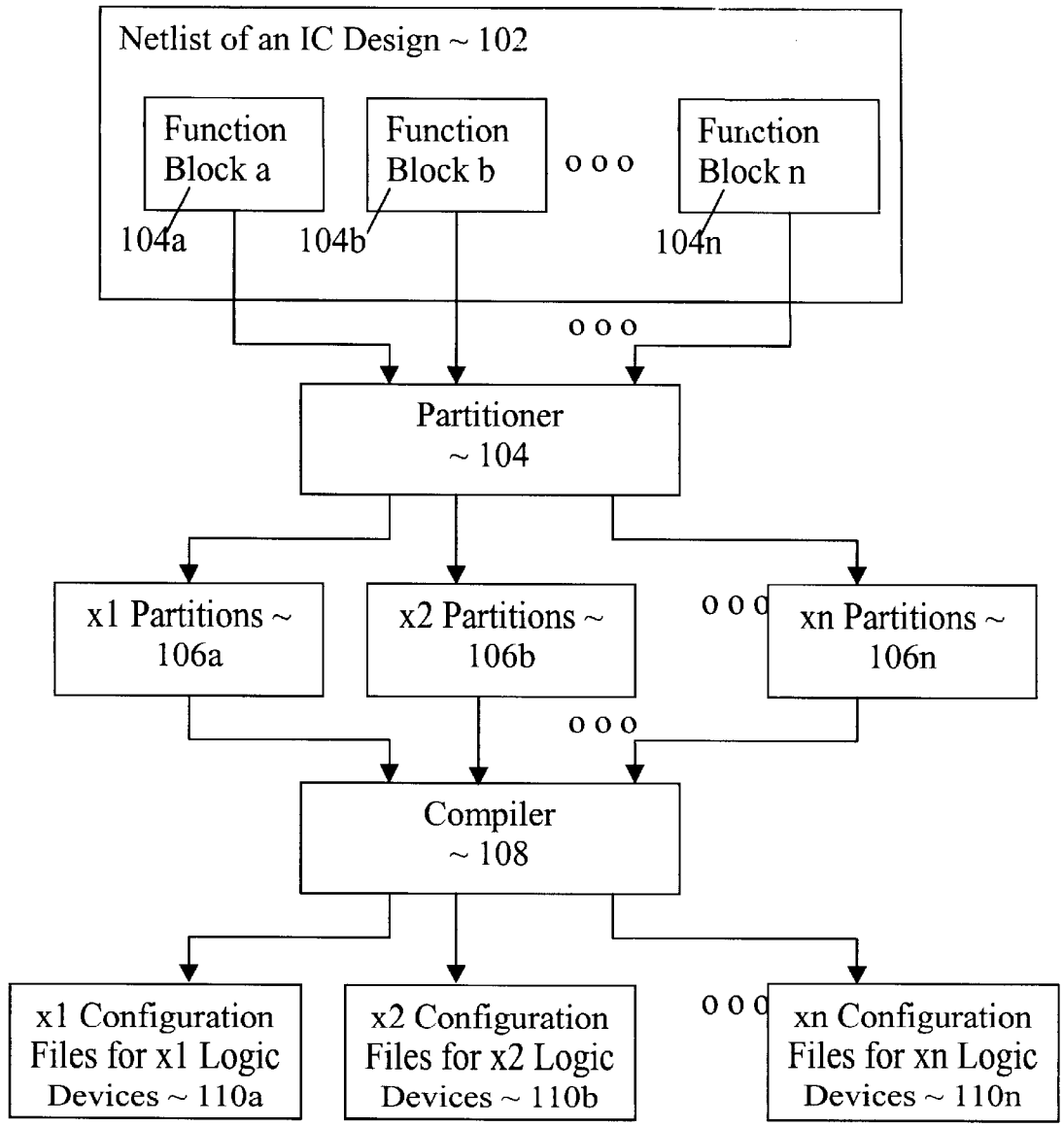
FIG. 1 illustrates a typical prior art approach to partitioning a circuit design with multiple function blocks.
Figure 2:
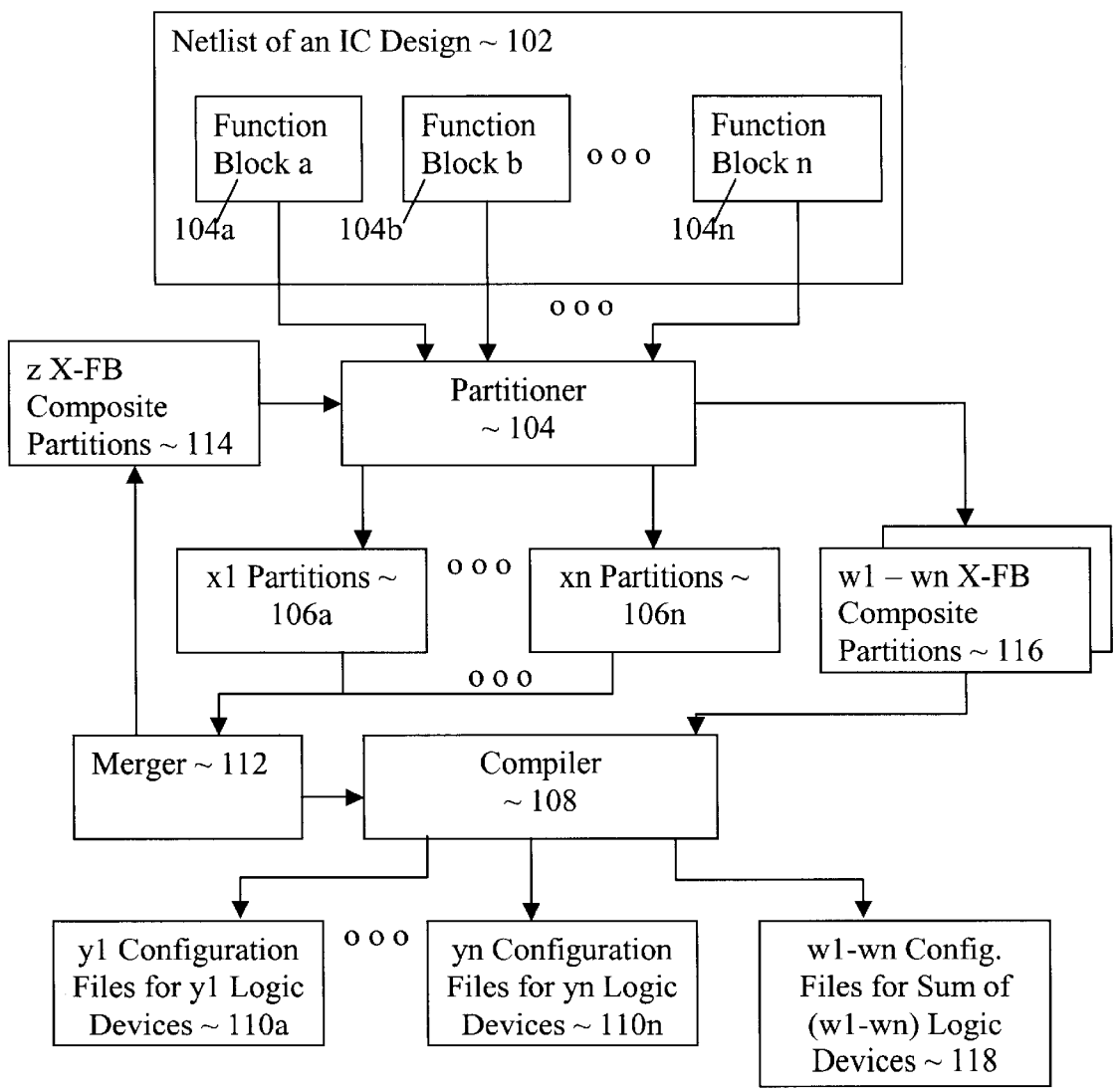
FIG. 2 illustrates the partitioning approach of the present invention, in accordance with one embodiment.

Referring now to FIG. 2, wherein a block diagram illustrating an overview of the method of the present invention for partitioning and placing a circuit design onto a number of reconfigurable logic devices, is shown. As alluded to earlier, the partition and placement may be performed for the purpose of implementing or emulating the circuit on the reconfigurable logic devices, which may e.g. be general purpose or emulation specific FPGAs. Examples of general purpose FPGAs include but are not limited to those available from manufacturers such as Xilinx and Altera, both of San Jose, Calif.; and examples of emulation specific FPGA include but are not limited to the FPGA disclosed is U.S. Pat. No. 5,573,388.

As illustrated, the partitioning and placement process of the present invention starts as the prior art process with the netlists of the function blocks of a circuit design, such as function blocks 104a–104n of IC design 102, being provided along function block lines to a partitioner, such as partitioner 104, to be correspondingly partitioned along function block lines into partitions 106a–106n. That is, the partitioning results in x1 partitions 106a for FB-a 104a, x2 partitioned partitions 106b for FB-b 104b, and so forth.

However, from this point on, the process of the present invention advantageously diverges from the prior art. Instead of correspondingly compiling all partitions 106a–106n into configuration files to configure corresponding reconfigurable logic devices to implement or emulate the constituting elements of the partitions 106a–106n, partitions 106a–106n are provided to merger 112 for processing.

Merger 112 analyzes the partitions 106a–106n, and accords them different treatment in accordance with the results of the analysis. More specifically, in accordance with one embodiment, merger 112 determines if each of the partitions 106a–106n is to be considered a "majority" partition or a "minority" partition. In one embodiment, a "majority" partition is a partition that contains a percentage of the constituting elements of the corresponding function block in excess of a predetermined threshold percentage (e.g. 5%), whereas a "minority" partition is a partition that contains a percentage of the constituting elements of the corresponding function block that is smaller than the predetermined threshold percentage.

The "majority" partitions are passed onto compiler 108 for corresponding compilation into configuration files 110a–110n for configuring corresponding reconfigurable logic devices to implement or realize the partitions. Accordingly, y1 configuration files for y1 logic devices will result for partition 106a, y2 configuration files for y2 logic devices will result for partition 106b, and so forth, where y1, y2, . . . yn are less than or equal to x1, x2, . . . xn, respectively.

The "minority" partitions, on the other hand are merged into one or more (z) composite partitions 114. In one embodiment, the "minority" partitions are merged in accordance with the operating clock domains of the "minority" partitions. That is, "minority" partitions with the same operating clock domain are merged together across function blocks. The merged composite partitions in turn are provided to partitioner 104 to be partitioned again. As shown, the partitioning results in w1 through wn cross function composite partitions 116. These composite partitions 116 are then in turn provided to compiler 108 for compilation into w1 through wn configuration files for correspondingly configuring a sum of w1 through wn reconfigurable logic devices to implement or realize the constituting elements of these partitions. Experience has shown that a smaller number of reconfigurable logic devices will be required to implement or realize the circuit elements of these "minority" partitions, as compared to the prior art approaches.

For example, if a dozen minority partitions are merged into two composite partitions, the two composite partitions are re-partitioned, with the first composite partition partitioned into e.g. 2 composite partitions and the second composite partition partitioned into e.g. 3 partitions. The 5 composite partitions are then compiled into 5 configuration files for configuring 5 reconfigurable logic devices. Thus, 5 reconfigurable logic devices will be used to implement or realize the circuit elements of these "minority" partitions, as opposed to a dozen of reconfigurable logic devices under the prior art.

Except for merger 112, partitioner 104 and compiler 108 are intended to represent a broad range of such elements known in the art. Accordingly, except for merger 112, which will be described in more below, partitioner 104 and compiler 108 will not be further described. From the description to follow, and as it is known for partitioner 104 and compiler 108, each of these elements, merger 112, partitioner 104 and compiler 108 may be implemented in any one or more of a number of programming languages known in the art.

Figure 3:
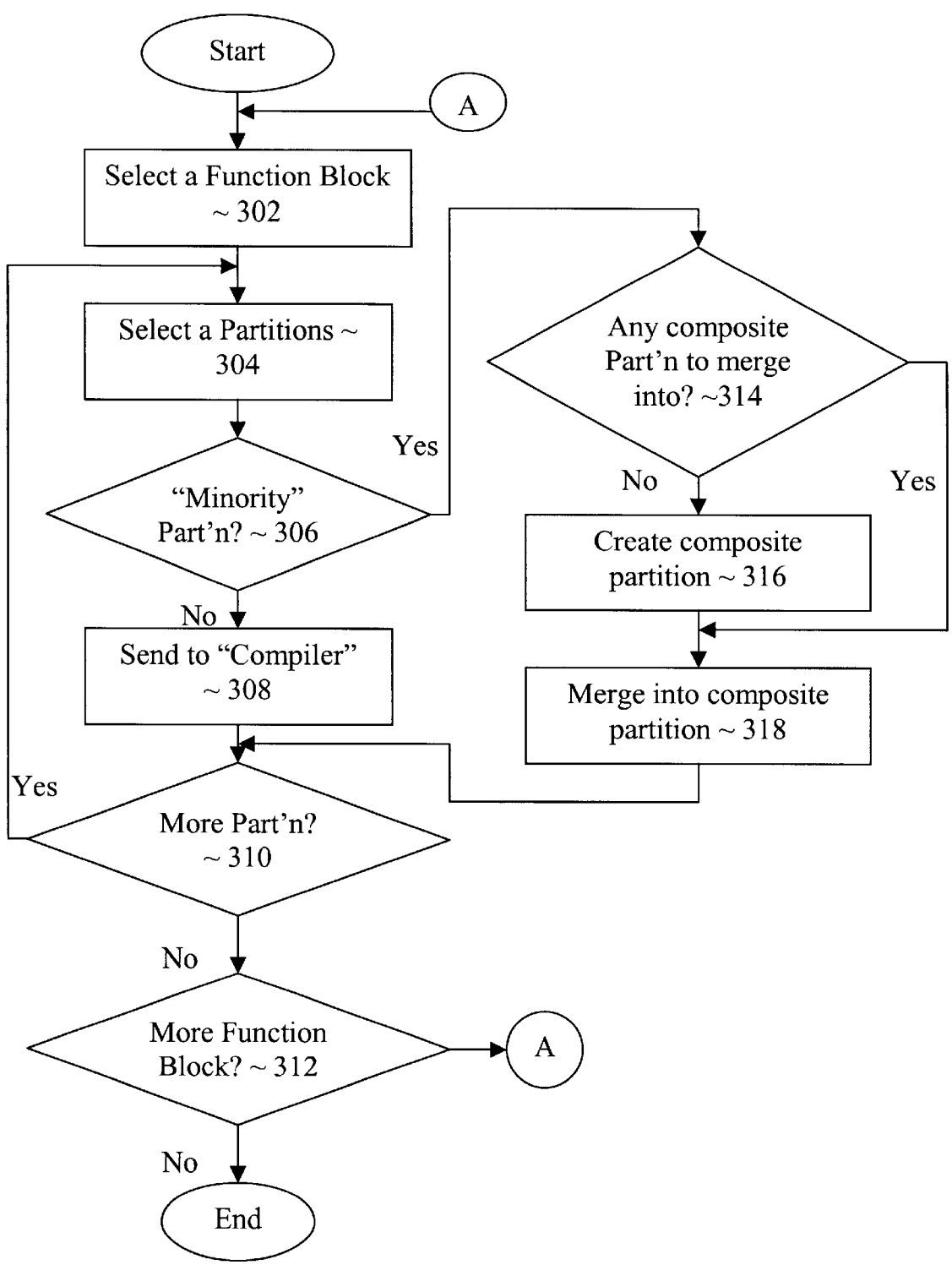
FIG. 3 illustrates the operation flow of the relevant aspects of the merge function of FIG. 2, in accordance with one embodiment.

Refer now to FIG. 3, wherein a flow diagram illustrating the operating flow of the relevant aspects of merger function 112 of FIG. 2, in accordance with one embodiment, is shown. As illustrated, the process starts with merger function 112 selecting a function block for analysis, block 302; more specifically, the partitions of the function block. As will be apparent from the totality of the description, the order through which the function blocks are selected for analysis is immaterial, as long as they all get selected and analyzed. At block 304, merger function 112 selects a specific partition of the currently selected function block for analysis. Similarly, the order through which the partitions of a selected function block are selected for analysis is immaterial, as long as they all get selected and analyzed. At block 306, merger function 112 determines if the selected partition is to be characterized as a "majority" or a "minority" partition, in accordance with e.g. a predetermined percentage threshold as described earlier.

As described earlier, if a partition being analyzed is to be characterized as a "majority" partition, the partition is provided to compiler 108 for compilation into a configuration file to configure a corresponding reconfigurable logic device to implement or emulate the circuit elements of the partition, block 308. On the other hand, if the partition being analyzed is to be characterized as a "minority" partition, the partition is merged into a composite partition instead. As described earlier, in one embodiment, the partitions are merged in accordance with their operating clock domain.

As illustrated, for the embodiment, merger function 112 determines whether a composite partition exists into which the "minority" partition may be merged, block 314. If such composite partition exists, the "minority" partition is merged into the composite partition accordingly, block 318. Otherwise, a new composite partition is first created, block 316, before merging the "minority" partition into the newly created composite partition.

Upon dispatching a "majority" partition to compiler 108 or upon merging a "minority" partition into a composite partition, the process continues at block 310, wherein merger function 112 determines if there are additional partitions of the selected function block to be analyzed. If so, the process returns to block 304 and continues from there as earlier described. If not, merger function 112 determines if there are additional function blocks to be analyzed. If so, the process returns to block 302 and continues from there as earlier described. If not, the process terminates.

Figures 4, 5:
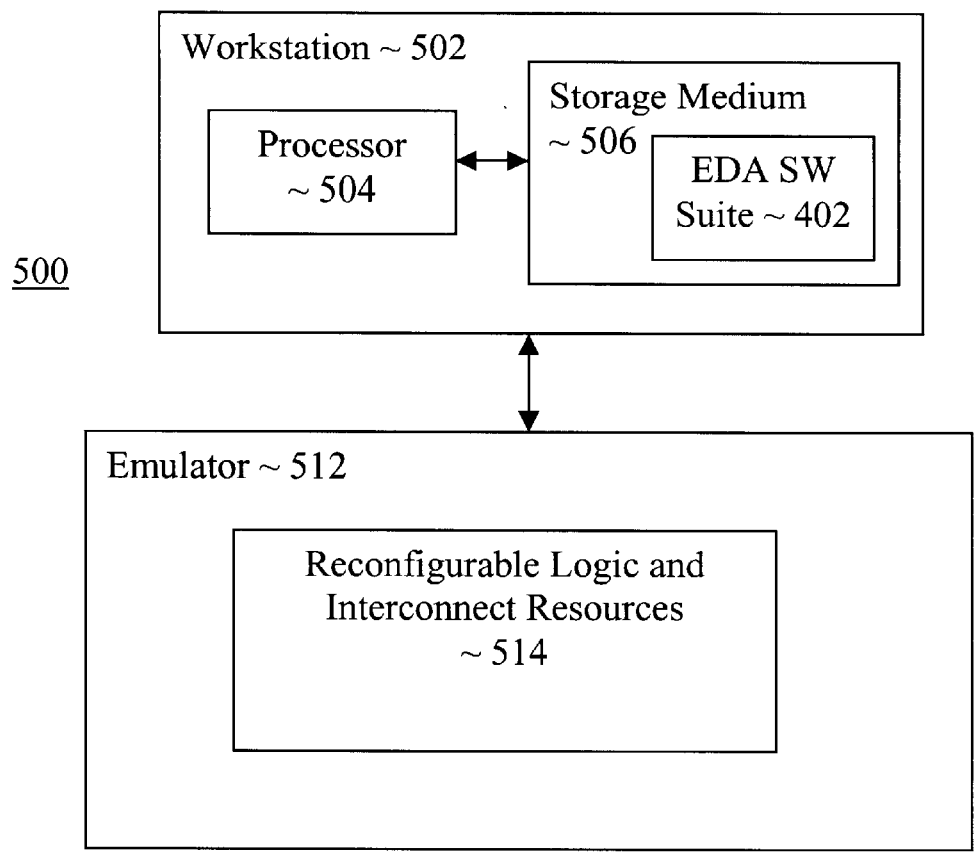
FIG. 4 illustrates the incorporation of the elements of the present invention in an EDA software suite, in accordance with one embodiment.
FIG. 5 illustrates the incorporation of the EDA software suite of FIG. 4 in a workstation, which may be a component of an emulation system, in accordance with one embodiment.

FIG. 4 illustrates the incorporation of the elements of present invention, i.e. partitioner 104, merger function 112 and compiler 108 into an Electronic Design Automation (EDA) software suite 402. Besides partitioner 104, merger function 112 and compiler 108, EDA software suite 402 may further include one or more other EDA tools known in the art. Examples of these tools include but are not limited to synthesis tools, place and route tools, design verification check tools, simulation and/or emulation tools, and the like.

FIG. 5 illustrates the incorporation of EDA software suite 402 in a workstation 502. Workstation 502 includes storage medium 506 for storing the implementing programming instructions of EDA software suite 402. Preferably, storage medium 506 include non-volatile as well as volatile storage for storing "permanent" as well as "temporal" (i.e. working) copies of the implementing programming instructions of EDA software suite 402. Workstation 502 also includes processor 504 coupled to storage medium 506 to execute the implementing programming instructions of EDA software suite 402.

Except for EDA software suite 402 incorporated therein, workstation 502 is otherwise intended to represent a broad range of computer systems known in the art. Suitable systems include but are not limited to those available from Dell Computer of Austin, Tex. and Hewlett Packard of Palo Alto, Calif.

For the illustrated embodiment, workstation 502 is a component of emulation system 500. In addition to workstation 502, emulation system 500 further includes emulator 512 having a number of reconfigurable logic devices (with reconfigurable logic resources) and reconfigurable interconnect resources for realizing circuit designs. Partitioner 104, merger 112 and compiler 108 are employed to partition and place a circuit design onto selected ones of the reconfigurable logic resources 514 of emulator 512 in accordance with the more efficient cross function block manner of the present invention. As a result, for an emulator 512 having a given size of reconfigurable logic resources 514, a large circuit design may be emulated. As those skilled in the art will recognize, this is a significant advantage in view of continuous increase in size and complexity of circuit design, and the cost of emulation systems.

Except for the elements of the present invention incorporated therein, emulation system 500 is also otherwise intended to represent a broad range of emulation systems known in the art. Examples of such emulation systems include but are not limited to the SimExpress and Celaro emulation systems available from the Meta System Division, Les Ulis, France, of Mentor Graphics Corp. of Wilsonville, Oreg., USA.

Figure 6:
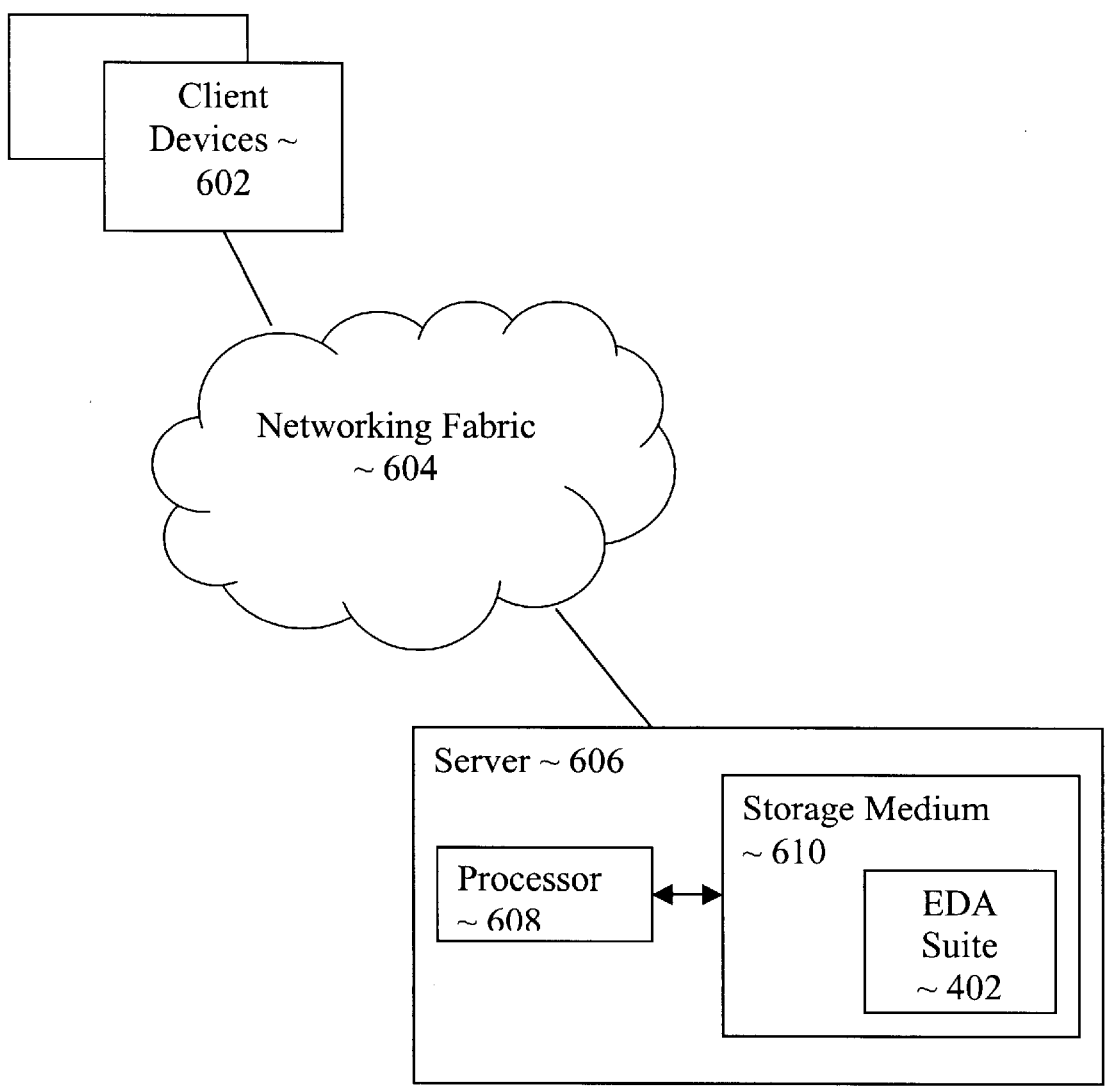
FIG. 6 illustrates the incorporation of the EDA software suite of FIG. 4 in a networked server, in accordance with one embodiment.

FIG. 6 on the other hand illustrates the incorporation of the EDA software suite 402 having partitioner 104, merger 112 and compiler 108 of the present invention, onto server 606. Similar to workstation 502, server 606 includes storage medium 610 and one or more processors 608 for storing and executing EDA software suite 402. Server 606 also includes a number of networking/communication resources (not shown) for making EDA software suite 402, including partitioner 104, merger 112 and compiler 108 of the present invention available for use by remote client devices 602 across networking fabric 604.

Server 606 may be any one of a number of "mid-range" to "high-end" servers known in the art, including but are not limited to those available from manufacturers such as IBM of Armonk, N.Y. and Sun Microsystems of Menlo Park, Calif. Client devices 602 may be any one of a number of networking/communication enabled computing devices known in the art, including but are not limited to those examples enumerated earlier for workstation 502. Networking fabric 604 is intended to represent private LAN or WAN of "private" enterprises, as well as public networks, such as the Internet.

Thus, a method and apparatus for partitioning and placement of a circuit design onto reconfigurable logic devices in a cross function block manner have been described. While the method and apparatus of the present invention have been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A method comprising:

receiving a first and a second netlist of a first and a second function block of a circuit design;

correspondingly partitioning said first and second netlists of said first and second function blocks into at least a first and a second partition, and a third and a fourth partition respectively for correspondingly determining placement of constituting elements of said first and second netlists on logic devices, with the first partition having a majority of the constituting elements of said first netlist, the second partition having a minority of the constituting elements of said first netlist, the third partition having a majority of the constituting elements of said second netlist, and the fourth partition having a minority of the constituting elements of said second netlist;

merging said second and fourth partitions having minorities of the constituting elements of said first and second netlists to form a first composite partition of minority constituting elements of said first and second netlists of said first and second function blocks; and partitioning said first composite partition for jointly determining placement of these minority constituting elements of said first and second netlists of said first and second function blocks on logic devices.

2. The method as set forth in claim 1, wherein the method further comprises correspondingly determining whether the amounts of constituting elements of said second and fourth partitions of minority constituting elements of said first and second netlists are below a first and a second threshold respectively, and said merging and said partitioning performed after said merging are conditionally performed only if the amounts of constituting elements of said second and fourth partitions of minority constituting elements of said first and second netlists are determined to be below said first and second thresholds respectively.

3. The method as set forth in claim 1, wherein the first and second thresholds are the same threshold.

4. The method as set forth in claim 1, wherein the constituting elements of the first partition are to operate in a first clock domain, the constituting elements of the third partition are to operate in a second clock domain, and the constituting elements of the second and fourth partitions are to operate in a common third clock domain.

5. The method as set forth in claim 4, wherein the first and second clock domains are the same clock domain.

6. The method as set forth in claim 1, wherein the method further comprises:

placing said constituting elements onto logic devices, including interconnecting elements of the logic devices employed to place said constituting elements.

7. The method as set forth in claim 1, wherein said logic devices are electrically reconfigurable logic devices.

8. The method as set forth in claim 7, wherein said electrically reconfigurable logic devices are field programmable gate arrays.

9. The method as set forth in claim 1, wherein said partitioning of said first and second netlists further results in a fifth and a sixth partition of the constituting elements of the first and second netlists respectively, with said fifth partition also having a minority of the constituting elements of said first netlist and said sixth partition also having a minority of the constituting elements of said second netlist;

said merging further comprises merging said fifth and said sixth partitions having minorities of the constituting elements of the first and second netlists to form a second composite partition of minority constituting elements of the first and second netlists of the first and second function blocks; and said partitioning performed after said merging further comprises partitioning said second composite partition of minority constituting elements of said first and second netlists of said first and second function blocks for jointly determining placement of these minority constituting elements of said first and second netlists of said first and second function blocks.

10. The method as set forth in claim 9, wherein the constituting elements of the first partition are to operate in a first clock domain, the constituting elements of the third partition are to operate in a second clock domain, the constituting elements of the second and fourth partitions are to operate in a common third clock domain, and the constituting elements of the second and fourth partitions are to operate in a common fourth clock domain.

11. An apparatus comprising:

storage medium having stored therein a plurality of programming instructions designed to operate the apparatus to:

receive a first and a second netlist of a first and a second function block of a circuit design, correspondingly partition said first and second netlists of said first and second function blocks into at least a first and a second partition and a third and a fourth partition respectively for determining placement of constituting elements of said first and second netlists on logic devices, with the first partition having a majority of the constituting elements of said first netlist, the second partition having a minority of the constituting elements of said first netlist, the third partition having a majority of the constituting elements of said second netlist, and the fourth partition having a minority of the constituting elements of said second netlist, merge said second and fourth partitions having minorities of the constituting elements of said first and second netlists to form a fifth partition of minority constituting elements of said first and second netlists of said first and second function blocks, and partition said fifth partition for jointly determining placement of these minority constituting elements of said first and second netlists of said first and second function blocks on logic devices; and one or more processors coupled to the storage medium to execute said programming instructions.

12. The apparatus as set forth in claim 11, wherein the programming instructions are further designed to operate the apparatus to correspondingly determine whether the amounts of constituting elements of said second and fourth partitions of minority constituting elements of said first and second netlists are below a first and a second threshold respectively, and to conditionally perform said merging and said partitioning performed after said merging only if the amounts of constituting elements of said second and fourth partitions of minority constituting elements of said first and second netlists are determined to be below said first and second thresholds respectively.

13. The apparatus as set forth in claim 11, wherein the first and second thresholds are the same threshold.

14. The apparatus as set forth in claim 11, wherein the constituting elements of the first partition are to operate in a first clock domain, the constituting elements of the third partition are to operate in a second clock domain, and the constituting elements of the second and fourth partitions are to operate in a common third clock domain.

15. The apparatus as set forth in claim 14, wherein the first and second clock domains are the same clock domain.

16. The apparatus as set forth in claim 11, wherein the programming instructions are further designed to operate the apparatus to place said constituting elements onto logic devices, including interconnecting elements of the logic devices employed to place said constituting elements.

17. The apparatus as set forth in claim 11, wherein said logic devices are electrically reconfigurable logic devices, and said apparatus further comprises said electrically reconfigurable logic devices.

18. The apparatus as set forth in claim 17, wherein said electrically reconfigurable logic devices are field programmable gate arrays.

19. The apparatus as set forth in claim 11, wherein said partitioning of said first and second netlists further results in a fifth and a sixth partition of the constituting elements of the first and second netlists respectively, with said fifth partition also having a minority of the constituting elements of said first netlist and said sixth partition also having a minority of the constituting elements of said second netlist;

said programming instructions are further designed to operate the apparatus to further merge said fifth and said sixth partitions having minorities of the constituting elements of the first and second netlists to form a second composite partition of minority constituting elements of the first and second netlists of the first and second function blocks; and said programming instructions are further designed to operate the apparatus to further partition said second composite partition of minority constituting elements of said first and second netlists of said first and second function blocks for jointly determining placement of these minority constituting elements of said first and second netlists of said first and second function blocks.

20. The apparatus as set forth in claim 19, wherein the constituting elements of the first partition are to operate in a first clock domain, the constituting elements of the third partition are to operate in a second clock domain, the constituting elements of the second and fourth partitions are to operate in a common third clock domain, and the constituting elements of the second and fourth partitions are to operate in a common fourth clock domain.

21. The apparatus as set forth in claim 11, wherein said apparatus is a selected one of a workstation and a networked server.

* * * * *